(12) United States Patent
Mustafa et al.

(10) Patent No.: US 8,508,296 B1
(45) Date of Patent: Aug. 13, 2013

(54) TUNABLE DIRECTIONAL POWER COMBINER

(75) Inventors: Omar Mustafa, John's Creek, GA (US); Dirk Robert Walter Leipold, Califon, NJ (US)

(73) Assignee: Anadigics, Inc., Warren, NJ (US)

( * ) Notice: Subject to any disclaimer, the term of this patent is extended or adjusted under 35 U.S.C. 154(b) by 0 days.

(21) Appl. No.: 13/287,086

(22) Filed: Nov. 1, 2011

Related U.S. Application Data

(60) Provisional application No. 61/408,876, filed on Nov. 1, 2010.

(51) Int. Cl.
*H03F 3/68* (2006.01)

(52) U.S. Cl.
USPC ............ 330/124 R; 330/295; 330/302

(58) Field of Classification Search
USPC .................. 330/124 R, 302, 295
See application file for complete search history.

(56) References Cited

U.S. PATENT DOCUMENTS

| | | | | |
|---|---|---|---|---|
| 6,297,696 | B1 * | 10/2001 | Abdollahian et al. | 330/124 R |
| 6,989,711 | B2 * | 1/2006 | Camnitz et al. | 330/124 R |
| 7,183,843 | B1 * | 2/2007 | Jones et al. | 330/124 R |
| 7,256,650 | B1 * | 8/2007 | Stockert | 330/124 R |
| 7,656,964 | B1 * | 2/2010 | DeCoste et al. | 375/297 |
| 8,004,371 | B2 * | 8/2011 | Beaudin et al. | 333/133 |

* cited by examiner

*Primary Examiner* — Patricia Nguyen
(74) *Attorney, Agent, or Firm* — Ward & Zinna, LLC

(57) ABSTRACT

A quadrature amplifier comprises first and second amplifiers, each having an input and an output, a signal splitter connected to the inputs of the two amplifiers, a signal combiner connected to the outputs of the two amplifiers, and an impedance transformer connected to the output of the signal combiner. The signal splitter is a −3 dB hybrid that splits an input signal into two output signals of equal amplitude that are in phase quadrature. The signal combiner is a −3 dB hybrid that combines the output signals at the outputs of the two amplifiers. Since the output signals are in phase quadrature, the signals are combined to produce an inphase signal. The impedance transformer matches the output signal to an impedance of approximately 50 Ohms. Capacitive and resistive tuning networks connected to the ports of the signal combiner allow for adjustment of the center frequency and impedance of the signal combiner.

20 Claims, 3 Drawing Sheets

TUNABLE DIRECTIONAL POWER COMBINER

This application claims benefit of provisional application Ser. No. 61/408,876, filed Nov. 1, 2010, for TUNABLE DIRECTIONAL POWER COMBINER WITH HELP MODE FEATURES AND POWER DETECTION SCHEME, which is incorporated herein in its entirety.

BACKGROUND

Power detection today is done with dedicated 20 dB couplers, not directly on the forward path and generally only provides an amplitude signal without any phase information. Output matching network tuning is usually attempted at the 50 Ohm point, forcing the use of high voltage compliant technologies.

To build power amplifiers (PA) with low sensitivity to load phase and angle changes, the use of quadrature power amplifiers is becoming more and more common. These amplifiers are constructed by building two amplifiers, splitting the input signal into a 0 and a 90 degree path and then recombining the output in a hybrid, i.e. a 3 dB directional coupler. The directional coupler will combine the output of both amplifiers as an in phase signal at the output port, while any power coming into the output port will be reflected by the power amplifiers into the reference port where it will see a 180 deg phase shift and therefore will be cancelled.

However current implementations of hybrids are very large in area, only work over a limited frequency range and do not provide a feedback signal for the forward transmitted power. For example, the classic way of realizing high performance hybrids using quarter wavelength transmission lines is too large for power amplifier modules. This means that hybrids are realized using lumped components, i.e. using cross coupled resonators. As shown in FIG. 1, such a hybrid 100 has an input port 110, an output (or through or transmitted) port 120, a coupled (or auxiliary) port 130, and an isolated port 140 that is terminated by a resistor 145. The hybrid further includes first, second, third, fourth, fifth and sixth capacitors 161-166 and first and second cross-coupled inductors 171, 172, with each of the first, second, third and fourth capacitors connected between ground and a different one of the ports, with the first inductor 171 connected between the input port 110 and the output port 120, with the second inductor 172 connected between the coupled port 130 and the isolated port 140, with the fifth capacitor 165 connected between the input port 110 and the coupled port 130 and the sixth capacitor 166 connected between the output port 120 and the isolated port 140.

An illustrative embodiment of a prior art quadrature amplifier is depicted in FIG. 2. The amplifier comprises first and second amplifiers 210, 220, each having an input 212, 222 and an output 214, 224, a signal splitter 230, first and second impedance transformers 240, 250 connected to the outputs of the first and second amplifiers, and a signal combiner 260 connected to the outputs of the impedance transformers. Each amplifier 210, 220 may have one or more stages. Signal splitter 230 is a −3 dB hybrid that splits an input signal received at an input port 232 into two output signals of equal amplitude that are in phase quadrature (i.e., are 90 degrees apart in phase) at an output port 234 and a coupled port 236. One of these signals is conventionally referred to as the I signal and the other as the Q signal. One of the output signals from splitter 230 is applied to input 212 of amplifier 210 and the other output signal is applied to input 222 of amplifier 220.

The output impedance of each amplifier is on the order of 4 Ohms. The impedance matching transformers 240, 250 match this impedance to an impedance on the order of 50 Ohms. Signal combiner 260 is a −3 dB hybrid that combines the output signals at the outputs of the impedance matching networks 240, 250. Since the output signals are in quadrature, the signals are combined to produce an inphase signal at the output of the signal combiner. As is known in the art, a combiner can be made by using a splitter in reverse. Thus, combiner 260 receives the output signals from transformers 240, 250 at output port 264 and coupled port 266 and combines them to form an inphase signal at input port 262.

Implementation of quadrature power amplifiers such as those of FIG. 2 in modern communication equipment, however, is a challenge because of the physical size of the inductors required in the signal combiner.

BRIEF DESCRIPTION OF DRAWING

The invention will be more readily apparent from the following Detailed Description in which.

DETAILED DESCRIPTION

Figure 1:
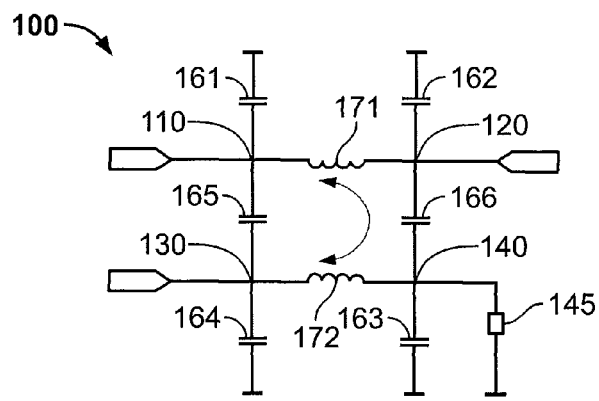
FIG. 1 is a schematic diagram of a lumped component hybrid.
Figure 2:
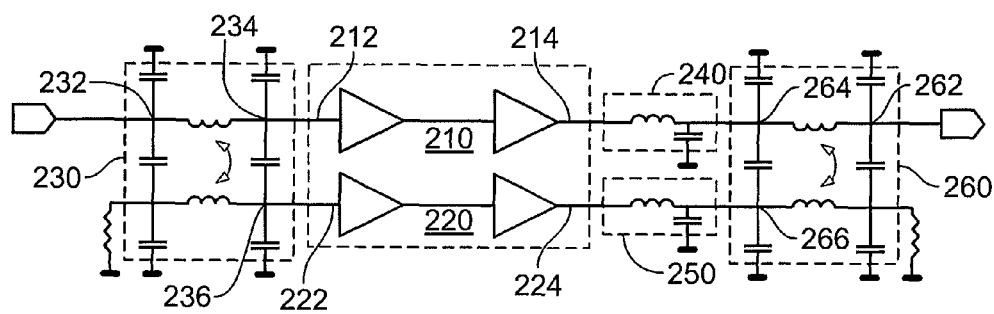
FIG. 2 is a schematic diagram of a prior art quadrature power amplifier.
Figure 3:
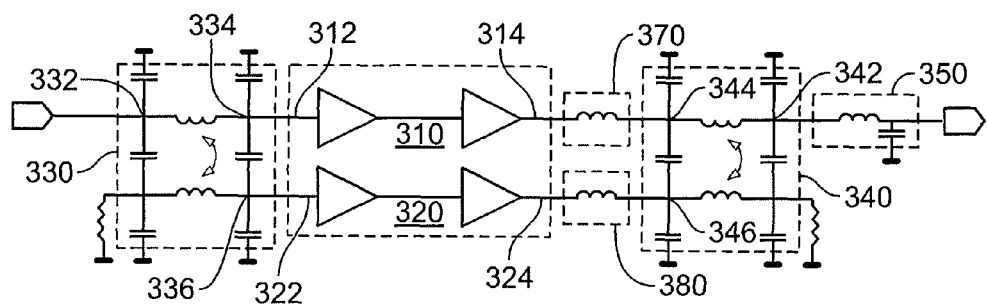
FIG. 3 is a schematic diagram of an illustrative embodiment of a quadrature power amplifier of the present invention.

An illustrative embodiment of a quadrature amplifier of the present invention is depicted in FIG. 3. The amplifier comprises first and second amplifiers 310, 320, each having an input 312, 322 and an output 314, 324, a signal splitter 330, a signal combiner 340 connected to the outputs of the first and second amplifiers, and an impedance transformer 350 connected to the output of the signal combiner 340. Each amplifier 310, 320 may have one or more stages. Signal splitter 330 is a −3 dB hybrid that splits an input signal received at an input port 332 into two output signals of equal amplitude that are in phase quadrature at an output port 334 and a coupled port 336. One of these signals is conventionally referred to as the I signal and the other as the Q signal. One of the output signals from splitter 330 is applied to input 312 of amplifier 310 and the other output signal is applied to input 322 of amplifier 320. Signal combiner 340 is a −3 dB hybrid that combines the output signals received from the outputs of amplifiers 310, 320 by output port 344 and coupled port 346 of combiner 340. Since the output signals are in quadrature, the signals are combined to produce an inphase signal at the input port 342 of the signal combiner. Again, the impedance transformer 350 matches the signal at port 342 to an impedance of approximately 50 Ohms.

By realizing the hybrid not at the 50 Ohm point but at a lower impedance, the size of the inductors needed to realize the hybrid is greatly reduced. Even as the requirements for the inductors become more demanding in terms of series resistance, it is easier to achieve this performance because the inductance values become smaller. This also allows the use of only one impedance matching network, instead of two, saving even more board area.

Optionally, the quadrature amplifier of FIG. 3 may also include pre-match circuits 370, 380 located between the outputs 314, 324 of amplifiers 310, 320 and the ports 344, 346 of combiner 340.

Because the impedance transformation is now happening after the hybrid as shown in FIG. 3, the voltages at the hybrid terminals are now reduced to less than 6V for power levels typical for cellular phone application, instead of the 40V typical for the 50 Ohm point. This makes it possible to touch this node with a regular CMOS process, where high performance tunable capacitors can be realized for voltages up to 6-10V.

Figure 4:
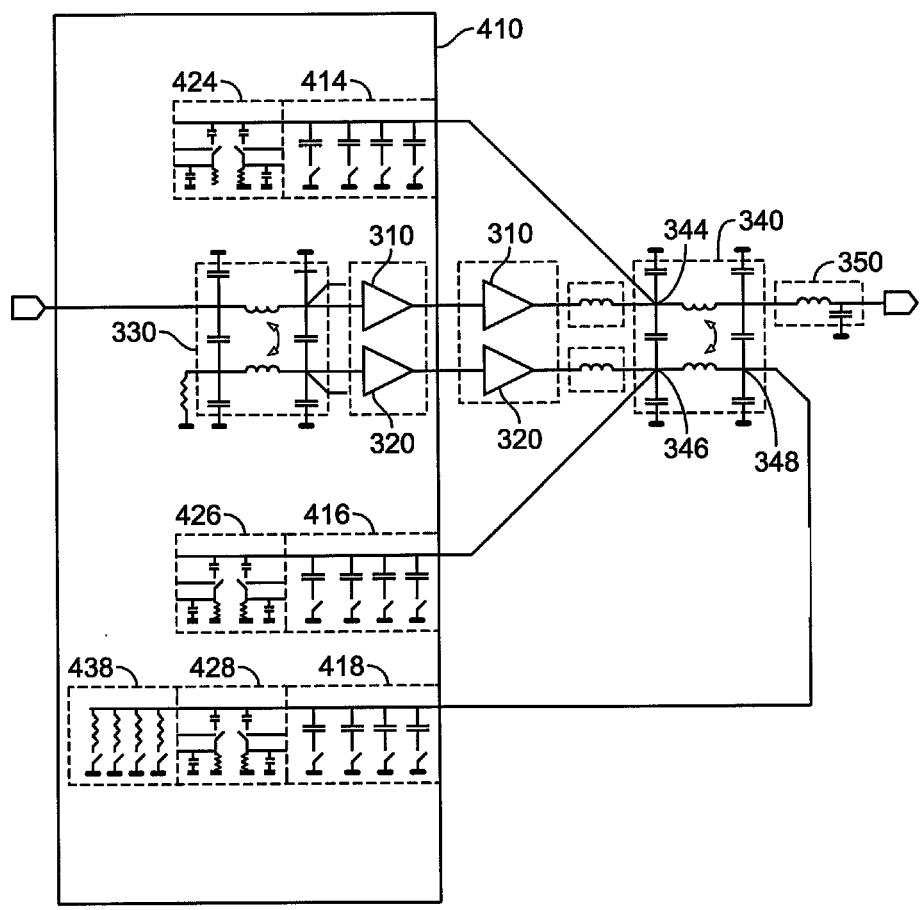
FIG. 4 is a schematic diagram depicting further details of the embodiment of FIG. 3.

To make the circuit tunable, the outputs of the power amplifiers and the reference port of the signal combiner are connected back to an active die providing a tunable capacitor, a tunable resistor, and/or an I?Q detector circuit as shown in FIG. 4. More particularly, FIG. 4 depicts amplifiers 310, 320, signal splitter 330, signal combiner 340, impedance transformer 350, and CMOS driver die 410. The operation of amplifiers 310, 320, signal splitter 330, combiner 340 and impedance transformer 350 is the same as that of the same numbered elements whose operation was described in conjunction with FIG. 3; and this description will not be repeated here. CMOS driver die 410 provides a first tunable capacitor circuit 414 and first I/Q detector circuit 424 connected to port 344 of combiner 340, a second tunable capacitor circuit 416 and a second I/Q detector circuit 426 connected to port 346 of combiner 340. and a third tunable capacitor circuit 418, a third I/Q detector circuit 428, and a first tunable resistor circuit 438 connected to the isolated (or reference) port 348 of the signal combiner 340.

The tunable circuits make it possible for the amplifier to work over a wide range of frequencies. The center frequency of the hybrid can be adjusted; and the impedance mismatch between the power amplifier and the isolated (or reference) port can be varied so that directivity of the hybrid can be maintained and insertion loss can be minimized. The resistive and capacitive tuning networks can also be used to change the characteristic impedance of the signal combiner, thereby changing the impedance presented to the power amplifiers and altering the loadline of the power amplifiers. The capacitive tuning network ca also be used to change the impedance transformation in the output matching network. Where the resistive and/or capacitive tuning networks can be adjusted to create a high impedance at the isolated node of the signal combiner, the signal combiner can be effectively turned off, changing the amplifier into a high efficiency single chain amplifier at half the output power.

Figure 5:
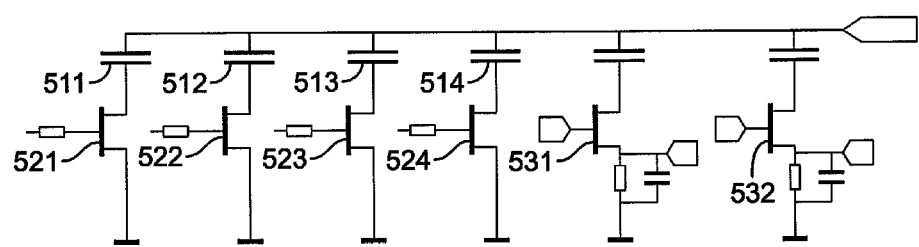
FIG. 5 is a schematic diagram of further details of certain tuning elements that may be used in the embodiment of FIG. 4.

The tunable capacitor circuits 414, 416, 418 comprise a plurality of capacitors of various sizes, built from a high voltage capacitor terminated by a boot-strapped NMOS based switch. Further details of tunable capacitor circuit 414 are shown in FIG. 5. The details of circuits 416 and 418 are the same. In particular, the tunable capacitor circuit comprises first, second, third, and fourth capacitors 511, 512, 513, 514 connected in series with FET switches 521, 522, 523, 524, respectively, between a power line and ground. The total capacitance connected by capacitor circuit 414, 416 or 418 can be varied by making different switches 521-524 conducting; and the range of variation in capacitance is extended by using capacitors of different sizes. As will be appreciated the use of four capacitors in circuits 414, 416, 418 is only illustrative. More capacitors or fewer capacitors could be used as required.

The I/Q detector circuits 424, 426, 428 each comprises a plurality of capacitors each of which is connected in series with an FET switch between a power line and ground. Further details of I/Q detector circuit 424 are shown in FIG. 5. The details of I/Q detector circuits 426 and 428 are the same. At least one FET switch 531 is controlled by the quadrature phase signal Q generated at the output port 334 of signal splitter 330 and at least one FET switch 532 is controlled by the inphase signal I generated at the coupled port 336 of signal splitter 330.

Figure 6:
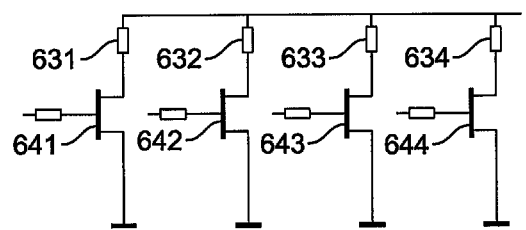
FIG. 6 is a schematic diagram of further details of other tuning elements that may be used in the embodiment of FIG. 4.

The resistor circuit 438 comprises a series of switchable resistors of various sizes as shown in FIG. 6. Circuit 438 comprises first, second, third and fourth resistors 631, 632, 633, 634 connected in series with FET switches 641, 642, 643, 644 between isolated port 348 of combiner 340 and ground. The total resistance connected by resistor circuit 438 can be varied by making different switches 641, 642, 643, 644 conducting. As will be appreciated, the number of resistors in circuit 438 is only illustrative. More or fewer resistors could be used as required.

By taking the signal coming back to this tuning semiconductor die and mixing the waveform at the reference port with the 0 and the 90 degree signals, amplitude and phase of the output signal under mismatch can be detected and can be used to optimize the phase and amplitude of the power amplifier driving the hybrid. The tuning of said capacitors can be optimized; the terminating resistance connected to the isolated port of the signal combiner can be adjusted; and the reflection from the antenna port can be minimized.

Alternative implementations of the invention include RF-MEMS tuners, diode based tuners, integrated passive devices (IPD) technologies for the integration of the tuner and/or the passive network.

As will be apparent to those skilled in the art, numerous variations may be practiced within the spirit and scope of the present invention.

What is claimed is:

1. A quadrature power amplifier (PA) comprising:
   a first amplifier having a first input and a first output;
   a second amplifier having a second input and a second output;
   a signal splitter configured for splitting an input signal received by the signal splitter into first and second output signals that are offset by 90 degrees from one another, said first output signal being provided to the first input of the first amplifier and said second output signal being provided to the second input of the second amplifier;
   a signal combiner having first, second and third ports, said signal combiner configured for combining first and second input signals received at the first and second ports of the signal combiner that are offset by 90 degrees from one another into an inphase signal at the third port of the signal combiner, said first and second ports of the signal combiner being connected to the first output of the first amplifier and the second output of the second amplifier, respectively; and
   an impedance transformation network connected to the third port of the signal combiner.

2. The power amplifier of claim 1 wherein the signal splitter is a −3 dB hybrid.

3. The power amplifier of claim 1 where the signal combiner is a −3 dB hybrid.

4. The power amplifier of claim 1 wherein the signal combiner is formed from lumped components.

5. A quadrature power amplifier (PA) comprising:
   a first amplifier having a first input and a first output;

a second amplifier having a second input and a second output;

a signal splitter configured for splitting an input signal received by the signal splitter into first and second output signals that are offset by 90 degrees from one another, said first output signal being provided to the first input of the first amplifier and said second output signal being provided to the second input of the second amplifier;

a signal combiner having first, second and third ports, said signal combiner configured for combining first and second input signals received at the first and second ports of the signal combiner that are offset by 90 degrees from one another into an inphase signal at the third port of the signal combiner, said first and second ports of the signal combiner being connected to the first output of the first amplifier and the second output of the second amplifier, respectively;

an impedance transformation network connected to the third port of the signal combiner; and a first capacitor tuning network coupled to the first port of the signal combiner and a second capacitor tuning network coupled to the second port of the signal combiner, said capacitor tuning networks enabling changes in a center frequency and characteristic impedance of the signal combiner.

6. The power amplifier of claim 5 wherein the first capacitor tuning network comprises a plurality of switched capacitors.

7. The power amplifier of claim 6 wherein at least some of the switched capacitors have different capacitance values.

8. The power amplifier of claim 6 wherein at least one of the first and second output signals from the signal splitter are used to control at least one of the switched capacitors.

9. The power amplifier of claim 1 further comprising a third capacitor tuning network coupled to an isolated port of the signal combiner.

10. The power amplifier of claim 9 wherein the third capacitor tuning network comprises a plurality of switched capacitors.

11. The power amplifier of claim 10 wherein at least some of the switched capacitors have different capacitance values.

12. The power amplifier of claim 10 wherein at least one of the first and second output signals from the signal splitter are used to control at least one of the switched capacitors.

13. The power amplifier of claim 1 further comprising a resistive tuning network connected to an isolated port of the signal combiner.

14. A quadrature power amplifier (PA) comprising:

a first amplifier having a first input and a first output;

a second amplifier having a second input and a second output;

a signal splitter configured for splitting an input signal received by the signal splitter into first and second output signals that are offset by 90 degrees from one another, said first output signal being provided to the first input of the first amplifier and said second output signal being provided to the second input of the second amplifier;

a signal combiner having first, second and third ports, said signal combiner configured for combining first and second input signals received at the first and second ports of the signal combiner that are offset by 90 degrees from one another into an inphase signal at the third port of the signal combiner, said first and second ports of the signal combiner being connected to the first output of the first amplifier and the second output of the second amplifier, respectively; and an impedance transformation network connected to the third port of the signal combiner wherein there is no impedance transformation network between the first and second ports of the signal combiner and the first and second outputs of the first and second amplifiers.

15. The power amplifier of claim 14 further comprising a third capacitor tuning network coupled to an isolated port of the signal combiner.

16. The power amplifier of claim 15 wherein the third capacitor tuning network comprises a plurality of switched capacitors.

17. The power amplifier of claim 16 wherein at least one of the first and second output signals from the signal splitter are used to control at least one of the switched capacitors.

18. The power amplifier of claim 14 further comprising a resistive tuning network connected to an isolated port of the signal combiner.

19. The power amplifier of claim 5 further comprising a third capacitor tuning network coupled to an isolated port of the signal combiner.

20. The power amplifier of claim 5 further comprising a resistive tuning network connected to an isolated port of the signal combiner.

* * * * *